(12) United States Patent
Hwang

(10) Patent No.: US 8,835,912 B2
(45) Date of Patent: Sep. 16, 2014

(54) ORGANIC LIGHT-EMITTING DIODE AND DISPLAY DEVICE HAVING THE SAME

(71) Applicant: Shenzhen China Star Optoelectronics Technology Co., Ltd., Guangdong (CN)

(72) Inventor: Tai-Jiun Hwang, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 101 days.

(21) Appl. No.: 13/695,436

(22) PCT Filed: Oct. 23, 2012

(86) PCT No.: PCT/CN2012/083340
§ 371 (c)(1),
(2), (4) Date: Oct. 31, 2012

(87) PCT Pub. No.: WO2014/059685
PCT Pub. Date: Apr. 24, 2014

(65) Prior Publication Data
US 2014/0110673 A1    Apr. 24, 2014

(30) Foreign Application Priority Data

Oct. 18, 2012  (CN) .......................... 2012 1 0397879

(51) Int. Cl.
*H01L 29/08* (2006.01)
*H01L 35/24* (2006.01)
*H01L 51/00* (2006.01)
*H01L 51/52* (2006.01)

(52) U.S. Cl.
CPC ............ *H01L 51/5262* (2013.01); *H01L 51/52* (2013.01)
USPC .......................................................... 257/40

(58) Field of Classification Search
USPC .......................................................... 257/40
See application file for complete search history.

(56) References Cited

U.S. PATENT DOCUMENTS

| | | | |
|---|---|---|---|
| 4,910,090 A * | 3/1990 | Kuhlman et al. | 428/469 |
| 5,398,046 A * | 3/1995 | Szegedi et al. | 345/174 |
| 5,486,847 A * | 1/1996 | Ranf et al. | 345/173 |
| 5,811,923 A * | 9/1998 | Zieba et al. | 313/479 |
| 6,104,530 A * | 8/2000 | Okamura et al. | 359/359 |
| 6,188,174 B1 * | 2/2001 | Marutsuka | 313/479 |
| 6,197,408 B1 * | 3/2001 | Kanbara et al. | 428/209 |
| 6,469,685 B1 * | 10/2002 | Woodruff et al. | 345/60 |
| 6,857,290 B2 * | 2/2005 | Duffy et al. | 65/23 |
| 7,605,538 B2 * | 10/2009 | Park | 313/582 |
| 8,269,212 B2 * | 9/2012 | Sarma | 257/40 |
| 8,624,305 B2 * | 1/2014 | Okita et al. | 257/291 |
| 2006/0094143 A1 * | 5/2006 | Haluzak et al. | 438/29 |
| 2006/0172147 A1 * | 8/2006 | Matsuura et al. | 428/690 |
| 2006/0240280 A1 * | 10/2006 | Liao et al. | 428/690 |
| 2007/0242055 A1 * | 10/2007 | Lai | 345/173 |

(Continued)

*Primary Examiner* — Yu-Hsi D Sun
*Assistant Examiner* — Grant Withers
(74) *Attorney, Agent, or Firm* — Andrew C. Cheng

(57) ABSTRACT

The present invention discloses an OLED panel and the OLED display device thereof. The OLED panel includes a metallic absorbing film, disposed on a light-out side of the OLED panel and grounded, for absorbing electromagnetic radiation produced by the OLED panel. The present invention uses the metallic absorbing film integrating on a glass substrate on a light-out side so that the metallic absorbing film absorbs the electromagnetic radiation from the OLED panel effectively and has the advantages of a simple structure and cheap material.

13 Claims, 4 Drawing Sheets

(56) References Cited

U.S. PATENT DOCUMENTS

| | | | |
|---|---|---|---|
| 2008/0129911 A1* | 6/2008 | Huang et al. | 349/44 |
| 2009/0090905 A1* | 4/2009 | Tokita et al. | 257/40 |
| 2009/0269871 A1* | 10/2009 | Yamazaki et al. | 438/29 |
| 2012/0056190 A1* | 3/2012 | Yamazaki et al. | 257/72 |
| 2012/0126208 A1* | 5/2012 | Kawamura et al. | 257/40 |
| 2012/0187447 A1* | 7/2012 | Eberhardt et al. | 257/99 |
| 2012/0225506 A1* | 9/2012 | Nguyen et al. | 438/26 |
| 2012/0228644 A1* | 9/2012 | Hunze et al. | 257/79 |
| 2012/0306812 A1* | 12/2012 | Lai et al. | 345/174 |
| 2013/0270533 A1* | 10/2013 | Crispin et al. | 257/40 |
| 2014/0034910 A1* | 2/2014 | Hwang | 257/40 |
| 2014/0093902 A1* | 4/2014 | Omenetto et al. | 435/29 |

* cited by examiner

ORGANIC LIGHT-EMITTING DIODE AND DISPLAY DEVICE HAVING THE SAME

BACKGROUND OF THE INVENTION

1. Field of the Invention

The present invention relates to a display technology field more particularly, to an organic light-emitting diode (OLED) and a display device having the OLED.

2. Description of the Prior Art

An OLED panel is a self-emissive display panel with advantages such as a simple structure and power saving.

With the popularity of an OLED panel, more and more electromagnetic radiation is emitted when an OLED display device works. Scientific studies have proved that electromagnetic radiation causes damage to human health in many aspects. People exposed by long-term electromagnetic radiation feel fatigue, eye sore even immune suppresion. Therefore, it is crucial for a human body to decline in electromagnetic radiation exposure.

Conventionally, an electromagnetic-shielding film pasted on a light-out side of an OLED panel by using glue is used to absorb electromagnetic radiation from the OLED panel. But the material cost of the electromagnetic-shielding film is expensive, the elimination of electromagnetic radiation is insufficient. In addition, the glue may deteriorate the display quality of the OLED to lessen productivity yield.

Therefore, it is necessary to provide an OLED panel and a display device having the OLED panel to solve the problem.

SUMMARY OF THE INVENTION

It is therefore a primary object of the present invention to provide an panel and a display device having the OLED panel capable of saving cost, raising yield and eliminating electromagnetic radiation from the OLED panel more effectively.

According to the present invention, an OLED panel comprises a first glass substrate, a second glass substrate opposite to the first glass substrate, a cathode layer, an emission layer, and an anode layer set up on the first glass substrate in order, and a metallic absorbing film. The second glass substrate is opposite to the first glass substrate and is connected to the first glass substrate to form an enclosed space. The metallic absorbing film disposed on a light-out side of the OLED panel, is used for absorbing electromagnetic radiation produced by the OLED panel. The metallic absorbing film is grounded.

In one aspect of the present invention, the metallic absorbing film is set up on a first surface of the second glass substrate away from the first glass substrate.

In another aspect of the present invention, the metallic absorbing film is set up on a second surface of the second glass substrate facing the first glass substrate and is within the enclosed space.

According to the present invention, an OLED panel comprises a metallic absorbing film, disposed on a light-out side of the OLED panel and integrated on the second glass substrate by electroplating, for absorbing electromagnetic radiation produced by the OLED panel. The metallic absorbing film is a wire netting and is grounded.

In one aspect of the present invention, the OLED panel further comprises a first glass substrate, a second glass substrate and a cathode layer, an emission layer, an anode layer set up on the first glass substrate in order. The first glass substrate and the second glass substrate arrange oppositely to form an enclosed space. The metallic absorbing film is set up on the second glass substrate.

In another aspect of the present invention, the metallic absorbing film is set up on a first surface of the second glass substrate away from the first glass substrate.

In another aspect of the present invention, the metallic absorbing film is set up on a second surface of the second glass substrate facing the first glass substrate and is within the enclosed space.

In another aspect of the present invention, the metallic absorbing film is a wire netting.

In another aspect of the present invention, the wire netting is integrated on the second glass substrate by electroplating.

In still another aspect of the present invention, a size of the wire netting is equal to a size of the second glass substrate.

In yet another aspect of the present invention, the metallic absorbing film and the OLED panel are connected to a ground electrode.

According to the present invention, an OLED display device comprising an OLED panel and a frame for fixing and protecting the OLED is provided. The OLED panel comprises a metallic absorbing film, disposed on a light-out side of the OLED panel and integrated on the second glass substrate by electroplating, for absorbing electromagnetic radiation produced by the OLED panel. The metallic absorbing film is a wire netting and is grounded.

In one aspect of the present invention, the OLED panel further comprises a first glass substrate, a second glass substrate and a cathode layer, an emission layer, an anode layer set up on the first glass substrate in order. The first glass substrate and the second glass substrate arrange oppositely to form an enclosed space. The metallic absorbing film is set up on the second glass substrate.

In another aspect of the present invention, the metallic absorbing film is set up on a first surface of the second glass substrate away from the first glass substrate.

In another aspect of the present invention, the metallic absorbing film is set up on a second surface of the second glass substrate facing the first glass substrate and is within the enclosed space.

In another aspect of the present invention, the metallic absorbing film is a wire netting.

In another aspect of the present invention, the wire netting is integrated on the second glass substrate by electroplating.

In another aspect of the present invention, a size of the wire netting is equal to a size of the second glass substrate.

In still another aspect of the present invention, the metallic absorbing film and the OLED panel are connected to a ground electrode.

In yet another aspect of the present invention, the OLED panel and the OLED display device are connected to a ground electrode.

In contrast to the prior art, the benefits of the present invention are that it uses a metallic absorbing film on a glass substrate on the light-out side to absorb static produced by the electromagnetic radiation from the OLED, release and conduct static voltages to ground so that the metallic absorbing film absorbs the electromagnetic radiation from the OLED effectively and has the advantages of a simple structure and cheap material.

Furthermore, the present invention uses the metallic absorbing film integrating with the OLED to avoid display deteriation caused by the paste of the elecromagnetic-shielding film in the prior art to enhance production yield.

DETAILED DESCRIPTION OF THE PREFERRED EMBODIMENTS

The present invention will be more apparent from the following detailed description taken in conjunction with the accompanying drawings.

Figure 1:
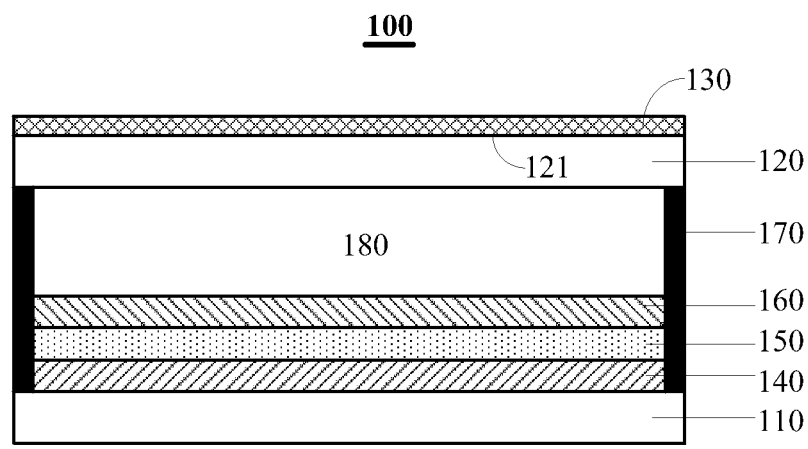
FIG. 1 shows a structure diagram of an OLED according to a first embodiment of the present invention.

FIG. 1 shows a structure diagram of an OLED according to a first embodiment of the present invention. An OLED panel 100 comprises a first glass substrate 100, a second glass substrate 120, a metallic absorbing film 130, a cathode layer 140, a emission layer 150 and an anode layer 160.

The first glass substrate 110 and the second glass substrate 120 are set up oppositely and stick together by a sealing glue 170 around the second glass substrate 120 so that the first glass substrate 110, the second glass substrate 120 and the sealing glue 170 form an enclosed space 180. The cathode layer 140, the emission layer 150 and the anode layer 160 are in the enclosed space 180 and are set up on the first glass substrate 110 in order, i.e. the cathode layer 140 is disposed on the first glass substrate 110, the emission layer 150 is disposed on the cathode layer 140, and the anode layer 160 is disposed on the emission layer 150.

The metallic absorbing film 130 arranges on a light-out side of the OLED panel 100 and is disposed on a first surface 121 of the second glass substrate 120 away from the first glass substrate 110 is. The metallic absorbing film 130 which is grounded is used for absorbing electromagnetic radiation from the OLED panel 100.

Figure 2:
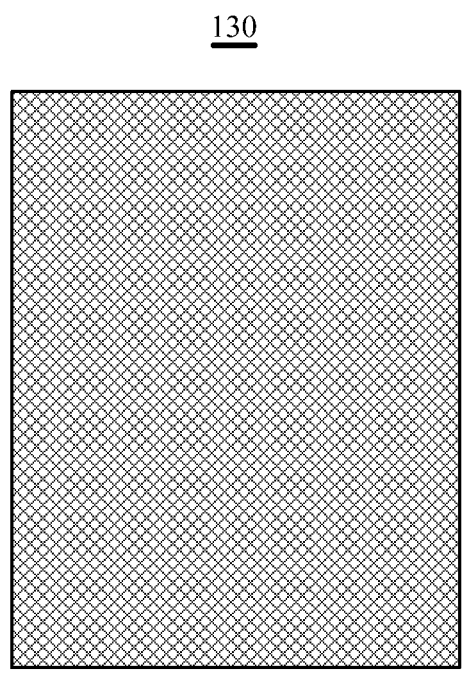
FIG. 2 is a structure diagram of the metallic absorbing film in FIG. 1 according to an embodiment of the present invention.

FIG. 2 is a structure diagram of the metallic absorbing film 130 in FIG. 1 according to an embodiment of the present invention. As FIG. 2 shows, the metallic absorbing film 130 made from reactive metal is a wire netting and is integrated onto the second glass substrate 120 by electroplating.

Figure 3:
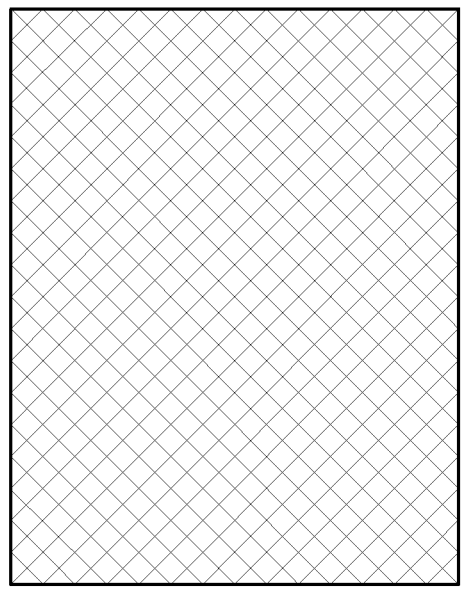
FIG. 3 illustrates a metallic absorbing film according to another embodiment of the present invention.

Grid size of the wire netting depends on a design for display effects of the OLED panel 100. For instance, FIG. 3 illustrates a metallic absorbing film 330 according to another embodiment of the present invention. More particularly, the larger the grid size is, the better the display effect of the OLED panel 100 is.

The size of the metallic absorbing film 130 of the embodiment is equal to the size of the first surface 121 of the second glass substrate 120, so that the metallic absorbing film 130 absorbs electromagnetic radiation from the OLED panel 100 as much as possible.

Figure 4:
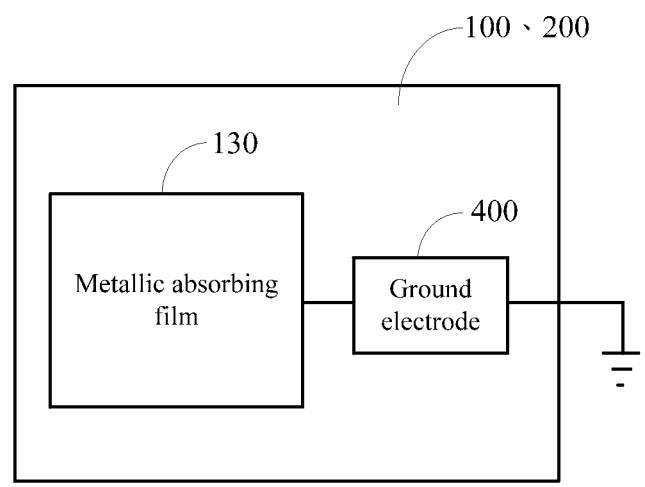
FIG. 4 illustrates a schematic diagram of the metallic absorbing film shown in FIG. 1 and the OLED panel connecting to a ground electrode in common.

As FIG. 4 shows, the metallic absorbing film 130 and the OLED panel 100 are connected to a ground electrode 400 for releasing static voltage from the metallic absorbing film 130 to ground via the around electrode 400.

The OLED panel 100 spreads electromagnetic radiation toward the light-out side, and the electromagnetic radiation is absorbed by the metallic absorbing film 130 while passing through the second glass substrate 120. The electromagnetic radiation gathers on the metallic absorbing film 130 to generate static, and then static voltages are released to ground via the ground electrode 400. Therefore, it prevents a human body from being exposed directly by the electromagnetic radiation from the OLED panel 100 so that it protects human health effectively.

Figure 5:
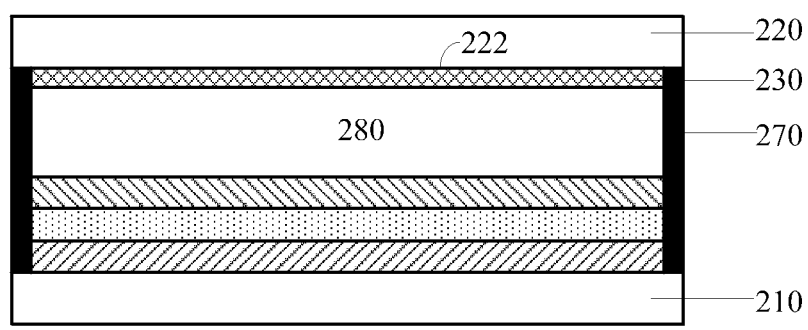
FIG. 5 is a structure diagram of an OLED panel according to a second embodiment of the present invention.

FIG. 5 is a structure diagram of an OLED panel according to a second embodiment of the present invention. A difference between the OLED panel 200 and the OLED panel 100 embodiment is:

A metallic absorbing film 230 is set up on a second surface 222 of a second glass substrate 220 facing a first glass substrate 210, and the metallic absorbing film 230 is within an enclosed space 280 which the first glass substrate 210, the second glass substrate 220 and a sealing glue 270 form.

Preferably, the size of the metallic absorbing film 230 is equal to the size of viewing areas of the OLED panel 200 for the metallic absorbing film 230 absorbs electromagnetic radiation from the OLED panel 200 as much as possible.

There is no further description for the principle that the OLED panel 200 absorbs and releases electromagnetic radiation via the metallic absorbing film 230 because the principle is the same with that the OLED panel 100 in FIG. 1 absorbs and releases electromagnetic radiation via the metallic absorbing film 130.

Figure 6:
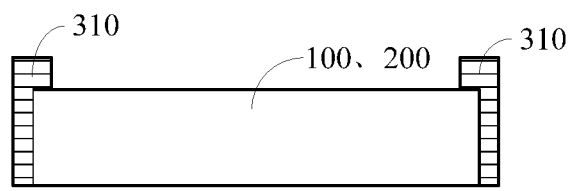
FIG. 6 is a structure diagram of an OLED display device according an embodiment of the present invention.

FIG. 6 is a structure diagram of an OLED display device according an embodiment of the present invention. As FIG. 6 shows, an OLED display device 300 comprises a frame 310, used for protecting and sticking the OLED panels 100, 200.

Figure 7:
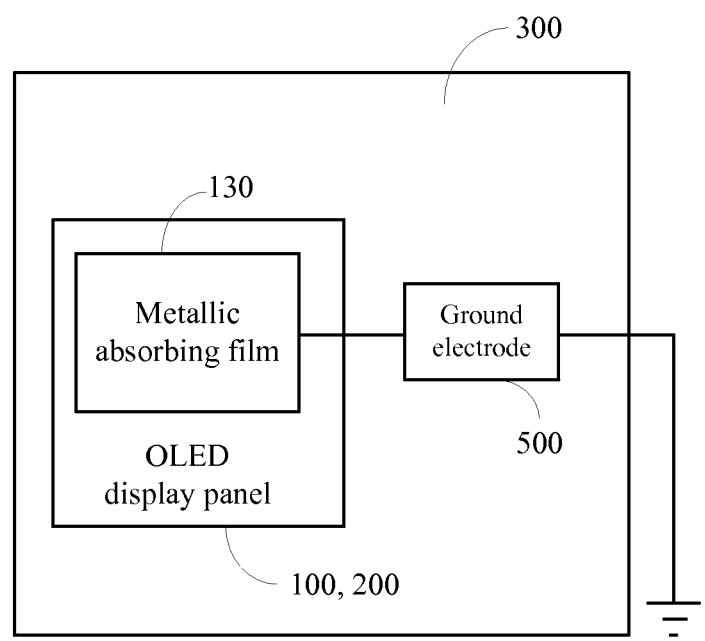
FIG. 7 illustrates a schematic diagram of an OLED panel and an OLED display device connecting to a ground electrode in common.

As FIG. 7 shows, the OLED panels 100, 200 and the OLED display device 300 connect to a ground electrode 500 for releasing static voltage from the metallic absorbing film 130 to ground via the ground electrode 500. The ground electrode 500 may be arrange inside or outside the OLED display device 300. For example, a ground terminal of a power plug used in the OLED display device 300 serves as the ground electrode 500.

In sum, the present invention uses a metallic absorbing film on a glass substrate on the light-out side to absorb static produced by the electromagnetic radiation from the OLED, release and conduct static voltages to the ground so that the metallic absorbing film absorbs the electromagnetic radiation from the OLED effectively and has advantages of a simple structure and low-cost.

Furthermore, the present invention uses the metallic absorbing film integrating with the OLED to prevent from display deteriation caused by the paste of the electromagnetic-shielding film in the prior art to enhance production yield.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. An OLED panel comprising;
   a metallic absorbing film, disposed on a light-out side of the OLED panel and integrated on a second glass substrate by electroplating, for absorbing electromagnetic radiation produced by the OLED panel;
   wherein the metallic absorbing film is a wire netting and is grounded.

2. The OLED panel of claim 1 further comprising a first glass substrate, the second glass substrate and a cathode layer, an emission layer, an anode layer set up on the first glass substrate in order, the first glass substrate and the second glass substrate arranged oppositely to form an enclosed space, and the metallic absorbing film is set up on the second glass substrate.

3. The OLED panel of claim 2, wherein the metallic absorbing film is set up on a first surface of the second glass substrate away from the first glass substrate.

4. The OLED panel of claim 2, wherein the metallic absorbing film is set up on a second surface of the second glass substrate facing the first glass substrate and is within the enclosed space.

5. The OLED panel of claim 1, wherein a size of the wire netting is equal to a size of the second glass substrate.

6. The OLED panel of claim 1, wherein the metallic absorbing film and the OLED panel are connected to a ground electrode.

7. An OLED display device comprising an OLED panel and a frame for fixing and protecting the OLED, the OLED panel comprising:
a metallic absorbing film, disposed on a light-out side of the OLED panel, for absorbing electromagnetic radiation produced by the OLED panel;
wherein the metallic absorbing film is grounded, and the metallic absorbing film is a wire netting integrated on the second glass substrate by electroplating.

8. The OLED display device of claim 7, wherein the OLED panel comprises a first glass substrate, a second glass substrate and a cathode layer, an emission layer, an anode layer set up on the first glass substrate in order, the first glass substrate and the second glass substrate arrange oppositely to form an enclosed space, and the metallic absorbing film is set up on the second glass substrate.

9. The OLED display device of claim 8, wherein the metallic absorbing film is set up on a first surface of the second glass substrate away from the first glass substrate.

10. The OLED display device of claim 8, wherein the metallic, absorbing film is set up on a second surface of the second glass substrate facing the first glass substrate and is within the enclosed space.

11. The OLED display device of claim 7, wherein a size of the wire netting is equal to a size of the second glass substrate.

12. The OLED display device of claim 7, wherein the metallic absorbing film and the OLED panel are connected to a ground electrode.

13. The OLED display device or claim 7, wherein the OLED panel and the OLED display device are connected to a ground electrode.

* * * * *